(12) United States Patent
Wang et al.

(10) Patent No.: US 11,296,299 B2
(45) Date of Patent: Apr. 5, 2022

(54) DISPLAY PANEL, DISPLAY DEVICE AND MANUFACTURING METHOD OF DISPLAY PANEL

(71) Applicant: BOE TECHNOLOGY GROUP CO., LTD., Beijing (CN)

(72) Inventors: Guoying Wang, Beijing (CN); Zhen Song, Beijing (CN); Yicheng Lin, Beijing (CN); Ling Wang, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 84 days.

(21) Appl. No.: 16/757,081

(22) PCT Filed: Sep. 6, 2019

(86) PCT No.: PCT/CN2019/104756
§ 371 (c)(1),
(2) Date: Apr. 17, 2020

(87) PCT Pub. No.: WO2020/057379
PCT Pub. Date: Mar. 26, 2020

(65) Prior Publication Data
US 2020/0251680 A1 Aug. 6, 2020

(30) Foreign Application Priority Data
Sep. 17, 2018 (CN) .......................... 201811079072.4

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3246* (2013.01); *H01L 51/0024* (2013.01);
(Continued)

(58) Field of Classification Search
CPC .................................................. H01L 51/5246
See application file for complete search history.

(56) References Cited

U.S. PATENT DOCUMENTS 6,704,072 B2 * 3/2004 Jeong .................... G02F 1/1339
349/73
6,781,162 B2 * 8/2004 Yamazaki ........... H01L 27/3276
257/184
(Continued)

FOREIGN PATENT DOCUMENTS

CN 1255648 A 6/2000
CN 1325537 A 12/2001
(Continued)

OTHER PUBLICATIONS

Machine translation, Hori, Japanese Pat. Pub. No. JP 2016-224220A, translation date: Sep. 20, 2021, Espacenet, all pages. (Year: 2021).*

(Continued)

*Primary Examiner* — Victoria K. Hall
(74) *Attorney, Agent, or Firm* — Armstrong Teasdale LLP

(57) ABSTRACT

The present disclosure relates to a display panel, a display device, and a method of manufacturing the display panel. The display panel includes a first substrate and a second substrate opposite to each other, a bonding portion that bonds a first peripheral region of the first substrate and a second peripheral region of the second substrate, and a protrusion disposed on at least one of the first peripheral region of the first substrate and the second peripheral region of the second substrate, wherein the protrusion is embedded in the bonding portion.

16 Claims, 5 Drawing Sheets

(51) Int. Cl.
*H01L 51/00* (2006.01)
*H01L 51/56* (2006.01)
*G09G 3/3208* (2016.01)

(52) U.S. Cl.
CPC ........... *H01L 51/56* (2013.01); *G09G 3/3208* (2013.01); *H01L 2227/323* (2013.01)

(56) References Cited

U.S. PATENT DOCUMENTS

| | | | | |
|---|---|---|---|---|
| 6,822,264 B2* | 11/2004 | Yamazaki | .............. | H01L 27/12 257/49 |
| 7,129,523 B2* | 10/2006 | Yamazaki | .............. | H01L 27/12 257/59 |
| 7,142,273 B1* | 11/2006 | Zhang | .................. | G02F 1/1339 349/139 |
| 7,265,391 B2* | 9/2007 | Yamazaki | ............. | H01L 27/322 257/88 |
| 7,402,945 B2* | 7/2008 | Yamazaki | ........... | H01L 51/5228 313/504 |
| 7,486,368 B2* | 2/2009 | Sakakura | ............ | H01L 51/5237 349/153 |
| 7,609,359 B2* | 10/2009 | Sekiguchi | ......... | G02F 1/133734 349/153 |
| 7,619,258 B2* | 11/2009 | Tsuchiya | ............ | H01L 51/5234 257/83 |
| 7,629,617 B2* | 12/2009 | Yamazaki | .............. | H01L 27/12 257/49 |
| 7,795,803 B2* | 9/2010 | Kim | ................... | H01L 51/5246 313/504 |
| 7,952,678 B2* | 5/2011 | Chan | ................... | G02F 1/1341 349/153 |
| 7,964,874 B2* | 6/2011 | Yamazaki | ......... | H01L 29/66757 257/71 |
| 8,045,122 B2* | 10/2011 | Kang | .................. | G02F 1/1333 349/152 |
| 8,089,066 B2* | 1/2012 | Yamazaki | ........... | H01L 51/5228 257/40 |
| 8,222,809 B2* | 7/2012 | Lee | .................... | H01L 27/3276 313/506 |
| 8,227,982 B2* | 7/2012 | Iwaki | ................ | H01L 51/5048 313/509 |
| 8,362,487 B2* | 1/2013 | Yamazaki | ........... | H01L 51/5253 257/72 |
| 8,382,545 B2* | 2/2013 | Sakakura | ............... | H05B 33/14 445/23 |
| 8,421,983 B2* | 4/2013 | Jung | .................... | G02F 1/1339 349/153 |
| 8,441,185 B2* | 5/2013 | Kuwabara | ........... | H01L 27/3246 313/506 |
| 8,710,734 B2* | 4/2014 | Amano | ............... | H01L 51/5253 313/504 |
| 8,866,384 B2* | 10/2014 | Wang | .................... | H05B 33/04 313/512 |
| 8,901,806 B2* | 12/2014 | Sakakura | ................ | H01L 33/44 313/483 |
| 9,153,631 B2* | 10/2015 | Sung | ................... | H01L 27/3276 |
| 9,257,668 B2* | 2/2016 | Choi | ................... | H01L 51/5246 257/88 |
| 9,257,670 B2* | 2/2016 | Sakakura | ................ | H01L 51/5237 |
| 9,425,429 B2* | 8/2016 | Kamiya | ................ | H01L 27/3246 |
| 9,442,326 B2* | 9/2016 | Oono | .................... | G02F 1/1341 |
| 9,508,953 B2* | 11/2016 | Sakakura | ............... | H05B 33/04 |
| 9,575,370 B2* | 2/2017 | Moriwaki | ............ | G02F 1/1339 |
| 9,651,829 B2* | 5/2017 | Park | .................. | G02F 1/133345 |
| 9,664,952 B2* | 5/2017 | Nagaoka | ............ | G02F 1/1339 |
| 9,679,919 B2* | 6/2017 | Go | ..................... | H01L 27/3276 |
| 9,741,783 B2* | 8/2017 | Cho | ................... | H01L 27/3276 |
| 9,759,955 B2* | 9/2017 | Ishikawa | ............ | G02F 1/1339 |
| 9,780,329 B2* | 10/2017 | Sakakura | ............ | H01L 27/3246 |
| 9,825,253 B2* | 11/2017 | Cho | ................... | H01L 27/3244 |
| 9,882,163 B2* | 1/2018 | Park | .................. | H01L 51/5246 |
| 9,891,475 B2* | 2/2018 | Lee | ..................... | G02F 1/1339 |
| 10,083,992 B2* | 9/2018 | Go | ..................... | H01L 27/124 |
| 10,120,241 B2* | 11/2018 | Tang | ................ | G02F 1/133514 |
| 10,128,465 B2* | 11/2018 | Kato | .................... | H01L 27/3276 |
| 10,270,056 B2* | 4/2019 | Sakakura | ............ | H01L 27/3262 |
| 10,429,696 B2* | 10/2019 | Kim | .................... | G02F 1/133707 |
| 10,446,793 B2* | 10/2019 | Kim | .................... | H01L 27/3225 |
| 10,497,768 B2* | 12/2019 | Jang | .................... | H01L 27/3276 |
| 10,505,143 B2* | 12/2019 | Song | ................... | H01L 27/3288 |
| 10,573,845 B2* | 2/2020 | Suzuki | .................. | H01L 51/525 |
| 10,606,129 B2* | 3/2020 | Lee | ..................... | G02F 1/133512 |
| 10,725,342 B2* | 7/2020 | Cho | ..................... | G02F 1/13394 |
| 10,825,885 B2* | 11/2020 | Moon | ................. | H01L 27/3276 |
| 10,937,840 B2* | 3/2021 | Lee | .................... | H01L 51/5246 |
| 10,978,667 B2* | 4/2021 | Dong | ................. | H01L 27/3244 |
| 11,016,348 B2* | 5/2021 | Song | .................. | G02F 1/134309 |
| 2002/0011975 A1* | 1/2002 | Yamazaki | ............. | H01L 51/524 345/76 |
| 2002/0057055 A1* | 5/2002 | Yamazaki | ........... | H01L 51/0025 313/506 |
| 2002/0149730 A1* | 10/2002 | Jeong | ..................... | G02F 1/1339 349/153 |
| 2002/0180371 A1* | 12/2002 | Yamazaki | ............ | H01L 27/3246 315/169.3 |
| 2002/0196393 A1* | 12/2002 | Tashiro | ................. | G02F 1/1341 349/106 |
| 2003/0094615 A1* | 5/2003 | Yamazaki | ............ | H01L 27/3244 257/72 |
| 2003/0222575 A1* | 12/2003 | Yamazaki | ............ | H01L 51/5203 313/504 |
| 2003/0227021 A1* | 12/2003 | Yamazaki | ............ | H01L 51/5271 257/83 |
| 2004/0185301 A1* | 9/2004 | Tsuchiya | ................ | H01L 51/524 428/690 |
| 2004/0263740 A1* | 12/2004 | Sakakura | ................ | H05B 33/04 349/138 |
| 2005/0046346 A1* | 3/2005 | Tsuchiya | ............. | H01L 51/5246 313/509 |
| 2005/0218396 A1* | 10/2005 | Tsuchiya | ............. | H01L 27/3246 257/13 |
| 2006/0132033 A1* | 6/2006 | Maeda | .................. | H01L 51/524 313/512 |
| 2006/0262267 A1* | 11/2006 | Sekiguchi | ......... | G02F 1/133734 349/187 |
| 2007/0210702 A1* | 9/2007 | Nakamura | ........... | H01L 51/5253 313/504 |
| 2007/0291216 A1* | 12/2007 | Chan | ..................... | G02F 1/1339 349/153 |
| 2008/0079360 A1* | 4/2008 | Kubota | ............... | H01L 51/5246 313/505 |
| 2008/0129946 A1* | 6/2008 | Chan | ..................... | G02F 1/1341 349/153 |
| 2009/0237775 A1* | 9/2009 | Ito | .......................... | G02F 1/167 359/296 |
| 2009/0322979 A1* | 12/2009 | Kang | .................... | G02F 1/1333 349/58 |
| 2012/0002145 A1* | 1/2012 | Lee | .................... | G02F 1/136204 349/106 |
| 2012/0033150 A1* | 2/2012 | Kim | ..................... | G02F 1/1341 349/43 |
| 2012/0049728 A1* | 3/2012 | Lee | ......................... | H01J 9/241 313/512 |
| 2013/0001608 A1* | 1/2013 | Amano | ............... | H01L 51/5246 257/88 |
| 2013/0265536 A1* | 10/2013 | Hashimoto | ....... | G02F 1/133502 349/153 |
| 2014/0183458 A1* | 7/2014 | Lee | ......................... | H01L 51/56 257/40 |
| 2015/0021573 A1* | 1/2015 | Kwak | ................ | H01L 51/5246 257/40 |
| 2015/0084498 A1* | 3/2015 | Choi | ................... | H01L 51/5246 313/504 |
| 2015/0091030 A1* | 4/2015 | Lee | ......................... | H01L 51/56 257/91 |
| 2015/0102293 A1* | 4/2015 | Cho | ..................... | H01L 51/5246 257/40 |
| 2015/0185516 A1* | 7/2015 | Lee | ......................... | G02F 1/1339 349/110 |

(56) References Cited

U.S. PATENT DOCUMENTS

| | | | | |
|---|---|---|---|---|
| 2015/0228927 A1* | 8/2015 | Kim | ................... | H01L 27/3276 257/40 |
| 2015/0340648 A1* | 11/2015 | Jang | ................... | H01L 51/5246 257/40 |
| 2016/0043346 A1* | 2/2016 | Kamiya | ............. | H01L 51/5246 257/40 |
| 2016/0077376 A1* | 3/2016 | Lee | ...................... | G02F 1/1339 349/106 |
| 2016/0104863 A1* | 4/2016 | Park | ................... | H01L 51/5246 257/88 |
| 2016/0377905 A1* | 12/2016 | Choi | ................... | G02F 1/1339 257/72 |
| 2017/0012243 A1* | 1/2017 | Suzuki | ............... | H01L 27/3258 |
| 2017/0040347 A1* | 2/2017 | Seo | ..................... | H01L 51/5246 |
| 2017/0187000 A1* | 6/2017 | Kato | .................. | H01L 27/3276 |
| 2017/0236886 A1* | 8/2017 | Matsueda | .......... | H01L 51/5246 257/40 |
| 2018/0031903 A1 | 2/2018 | Nagata | | |
| 2018/0033998 A1* | 2/2018 | Kim | ................... | H01L 27/3246 |
| 2018/0102502 A1* | 4/2018 | Kim | ................... | H01L 51/5256 |
| 2018/0183003 A1* | 6/2018 | Han | ................... | H01L 27/3237 |
| 2019/0081091 A1* | 3/2019 | Xin | ................... | H01L 27/3258 |
| 2019/0214598 A1* | 7/2019 | Harada | .................. | H01L 51/56 |

FOREIGN PATENT DOCUMENTS

| | | | | |
|---|---|---|---|---|
| CN | 1380634 | A | | 11/2002 |
| CN | 1735292 | A | | 2/2006 |
| CN | 101287314 | A | | 10/2008 |
| CN | 102347346 | A | | 2/2012 |
| CN | 107167941 | A * | 9/2017 | ............... G02F 1/13 |
| CN | 107167941 | A | | 9/2017 |
| CN | 107808896 | A * | 3/2018 | ......... H01L 27/3244 |
| CN | 107808896 | A | | 3/2018 |
| CN | 108257505 | A * | 7/2018 | ............... G09F 9/00 |
| CN | 108257505 | A | | 7/2018 |
| CN | 109243305 | A | | 1/2019 |
| JP | 02248076 | A | | 10/1990 |
| JP | H2-248076 | | * 10/1990 | ............. H01L 27/14 |
| JP | 2016-224220 | A * | 12/2016 | ............. G02F 1/133 |
| JP | 2016224220 | A | | 12/2016 |

OTHER PUBLICATIONS

Machine translation, Yamashita, Japanese Pat. Pub. No. JP H2-248076A, translation date: Sep. 20, 2021, Esapcenet, all pages. (Year: 2021).*
Machine translation, Zhai, Chinese Pat. Pub. No. CN 107808896A, translation date: Sep. 20, 2021, Espacenet, all pages. (Year: 2021).*
Machine translation, Zhang, Chinese Pat. Pub. No. CN 108257505A, translation date: Sep. 20, 2021, Espacenet, all pages. (Year: 2021).*
Machine translation, Zhou, Chinese Pat. Pub. No. CN 107167941A, translation date: Sep. 20, 2021, Espacenet, all pages. (Year: 2021).*
PCT International Search Report, Application No. PCT/CN2019/104756, dated Dec. 3, 2019, 8 pages: with English translation.
PCT Written Opinion, Application No. PCT/CN2019/104756, dated Dec. 3, 2019, 6 pages.: with English translation of relevant part.
China First Office Action, Application No. 201811079072.4, dated Mar. 20, 2020, 17 pps.: with English translation.

* cited by examiner

DISPLAY PANEL, DISPLAY DEVICE AND MANUFACTURING METHOD OF DISPLAY PANEL

CROSS REFERENCE TO RELATED APPLICATIONS

This patent application is a National Stage Entry of PCT/CN2019/104756 filed on Sep. 6, 2019, which claims the benefit and priority from Chinese Patent Application No. 201811079072.4 filed on Sep. 17, 2018, the disclosures of which are incorporated by reference herein in their entirety as part of the present application.

BACKGROUND

The present disclosure relates to the field of display technology. More specifically, it relates to a display panel, a display device, and a method of manufacturing the display panel.

Display devices for displaying images are increasingly appearing on the market. A better user experience places increasing demands on display technology. The encapsulation effect will affect the life of the display device, and the existing encapsulation effect still needs to be improved.

BRIEF DESCRIPTION

Embodiments of the present disclosure provide a display panel, a display device, and a method of manufacturing the display panel.

Embodiments of the present disclosure provide a display panel. In an embodiment, the display panel includes a first substrate and a second substrate opposite to each other, a bonding portion bonding a first peripheral region of the first substrate and a second peripheral region of the second substrate, and a protrusion disposed on at least one of the first peripheral region of the first substrate and the second peripheral region of the second substrate, wherein the protrusion is embedded in the bonding portion.

In some embodiments, the display panel further includes a light emitting device disposed on a side of the first substrate facing the second substrate and an encapsulation layer covering the light emitting device. Wherein, a projection of the bonding portion on the first substrate at least partially overlaps with a projection of the encapsulation layer on the first substrate.

In some embodiments, the protrusion includes a first protrusion provided in a first peripheral region of the first substrate and a second protrusion provided in a second peripheral region of the second substrate, wherein a projection of the first protrusion on the first substrate does not overlap a projection of the second protrusion on the first substrate.

In some embodiments, the display panel further includes a pixel definition layer on a side of the first substrate facing the second substrate and located between the first substrate and the light emitting device, wherein the first protrusion is arranged in a same layer as the pixel definition layer.

In some embodiments, a material of a portion in contact with the bonding portion of the encapsulation layer and a material of the bonding portion are either organic materials or either inorganic materials.

In some embodiments, the display panel further includes a driving circuit layer disposed between the first substrate and the first protrusion, wherein the light emitting device includes a first electrode, a light-emitting layer, and a second electrode sequentially disposed in a direction away from the first substrate. The pixel definition layer has a first portion located between the driving circuit layer and the light emitting layer and a second portion located between the first electrode and the light emitting layer. Wherein, the first portion extends beyond the second electrode in a direction toward the bonding portion.

In some embodiments, a projection of the second electrode on the first substrate overlaps with a projection of the encapsulation layer on the first substrate.

Embodiments of the present disclosure also provide a display device. The display device includes the display panel as described above.

Embodiments of the present disclosure also provide a method of manufacturing a display panel. The method includes providing a first substrate, providing a second substrate, wherein a protrusion is disposed on at least one of the first peripheral region of the first substrate and the second peripheral region of the second substrate, forming a bonding material on at least one of the first peripheral region of the first substrate and the second peripheral region of the second substrate, bonding the first substrate and the second substrate so that the bonding material forms a bonding portion bonding the first peripheral region and the second peripheral region, wherein the protrusion is embedded in the bonding portion.

In an embodiment, providing a first substrate includes forming a light emitting device on the first substrate, and forming an encapsulation layer covering the light emitting device on the light emitting device, wherein a projection of the bonding portion on the first substrate at least partially overlaps with a projection of the encapsulation layer on the first substrate.

In an embodiment, forming a light emitting device includes forming a first electrode and a driving circuit layer on the first substrate, disposing a pixel definition material layer on the first electrode and the driving circuit layer, and patterning the pixel definition material layer to form a pixel defining layer and a first protrusion, wherein the pixel defining layer covers a surface of the first substrate between the first electrode and the driving circuit layer, a part of an upper surface of the first electrode and a part of an upper surface of the driving circuit layer, forming a light emitting layer on the first electrode and a part of the pixel defining layer, and forming a second electrode on the light emitting layer.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1A:
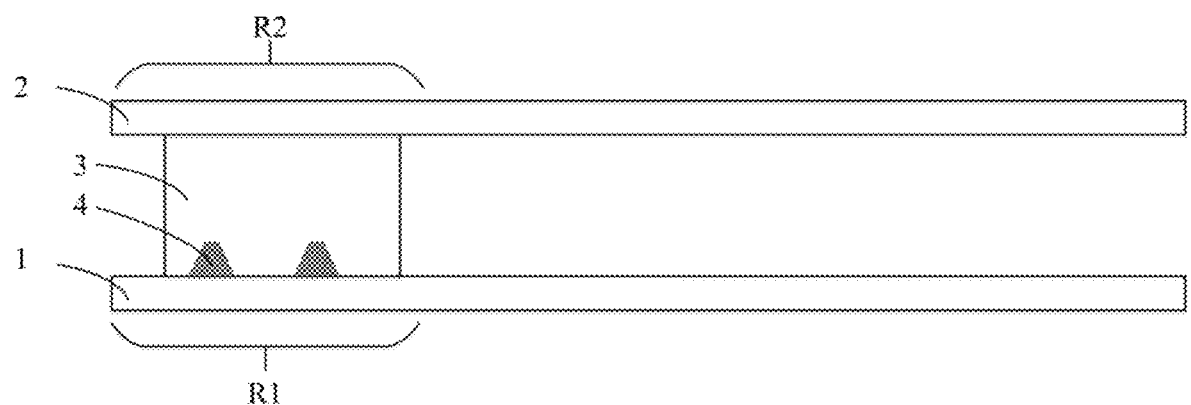
FIG. 1A is a schematic view of a display panel according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

FIG. 1A is a schematic view of a display panel according to an embodiment of the present disclosure. As shown in FIG. 1A, a display panel according to an embodiment of the present disclosure includes a first substrate 1 and a second substrate 2 opposite to each other, a bonding portion 3 that bonds a first peripheral region R1 of the first substrate 1 and a second peripheral region R2 of the second substrate 2, and a protrusion 4 disposed on at least one of the first peripheral region R1 of the first substrate 1 and the second peripheral region R2 of the second substrate 2. Wherein, the protrusion 4 is embedded in the bonding portion 3.

The display panel according to the embodiment of the present disclosure can increase the adhesion of the bonding portion 3, avoid peeling of the bonding portion, and improve production efficiency. Especially when applied to narrow-frame products, the display panel according to the present disclosure can ensure an encapsulation effect. The embodiments of the present disclosure can reduce the distance between the layers and the width of the bonding portion to achieve a narrow border display. The embodiments of the present disclosure do not need to improve the water blocking characteristics by increasing the width of the bonding portion 3 (for example, DAM glue), so that the process difficulty can be reduced and the process cost can be saved.

Figure 1B:
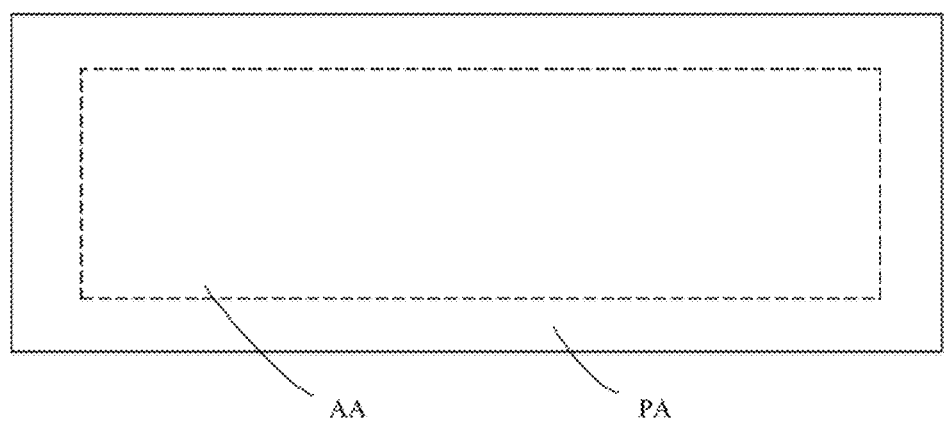
FIG. 1B is a schematic top view of a display panel according to an embodiment of the present disclosure.

FIG. 1B is a schematic top view of a display panel according to an embodiment of the present disclosure. As shown in FIG. 1B, the display panel includes a display area AA and a peripheral area PA. The bonding portion may be located in a peripheral area PA of the display panel.

Figure 2:
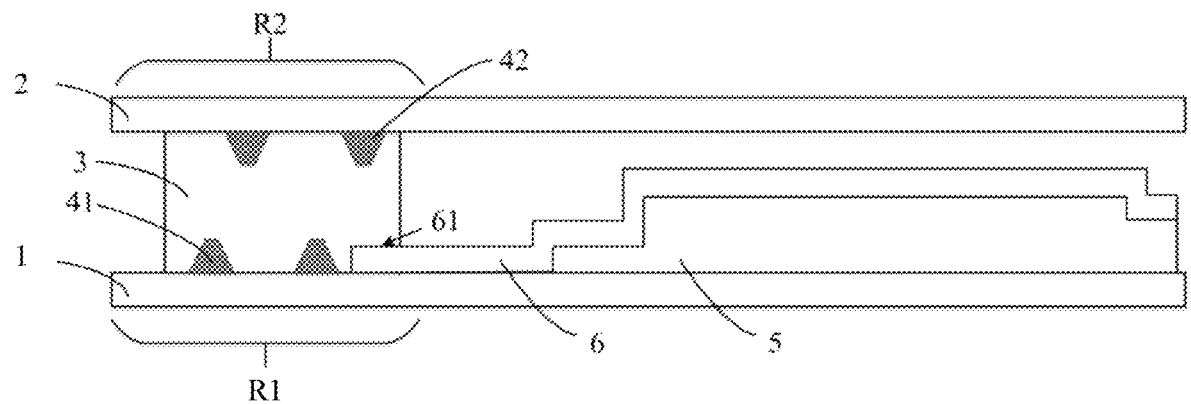
FIG. 2 is a schematic view of a display panel according to an embodiment of the present disclosure.

FIG. 2 is a schematic view of a display panel according to an embodiment of the present disclosure. As shown in FIG. 2, a display panel according to an embodiment of the present disclosure further includes a light emitting device 5 disposed on a side of the first substrate 1 facing the second substrate 2 and an encapsulation layer 6 covering the light emitting device 5. As shown in FIG. 2, a projection of the bonding portion 3 on the first substrate 1 at least partially overlaps with a projection of the encapsulation layer 6 on the first substrate 1.

According to some embodiments of the present disclosure, the material of the portion 61 in contact with the bonding portion 3 of the encapsulation layer 6 and the material of the bonding portion 3 may be either organic materials or either inorganic materials. This can enhance the adhesion between the bond portion and the encapsulation layer, thereby improving the encapsulating effect. The material of the encapsulation layer includes, but is not limited to, at least one of the following: an inorganic dielectric material, an organic dielectric material, and a high dielectric material (high-K material). Inorganic dielectric materials include, but are not limited to, SiOx, SiNx, and SiON. High-K materials include, but are not limited to, AlOx, HfOx, and TaOx.

Figure 3:
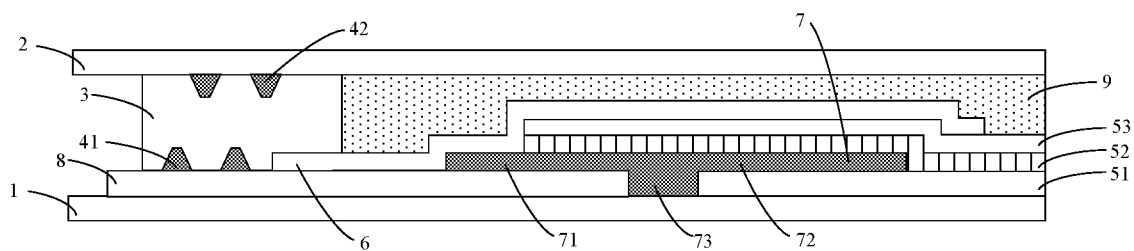
FIG. 3 is a schematic view of a display panel according to an embodiment of the present disclosure.

As shown in FIG. 2, the protrusion 4 may include a first protrusion 41 provided in a first peripheral region R1 of the first substrate 1 and a second protrusion 42 provided in a second peripheral region R2 of the second substrate 2. As shown in FIG. 3, a projection of the first protrusion 41 on the first substrate 1 does not overlap a projection of the second protrusion 42 on the first substrate 1.

FIG. 3 is a schematic view of a display panel according to an embodiment of the present disclosure. As shown in FIG. 3, the display panel according to an embodiment of the present disclosure further includes a pixel definition layer 7 on a side of the first substrate 1 facing the second substrate 2 and located between the first substrate 1 and the light emitting device 5. As shown in FIG. 3, the first protrusion 41 is arranged in a same layer as the pixel definition layer 7. It should be understood that, in the present disclosure, words "arranged in a same layer" refers to being formed from the same layer. In the embodiments of the present disclosure, the pixel definition layer can form a spacer between the first substrate and the second substrate, which effectively enhances the adhesion of the bonding portion without increasing process complexity, and improves production yield.

In some embodiments, a projection of the second electrode on the first substrate may overlap a projection of the encapsulation layer on the first substrate.

Figure 7:
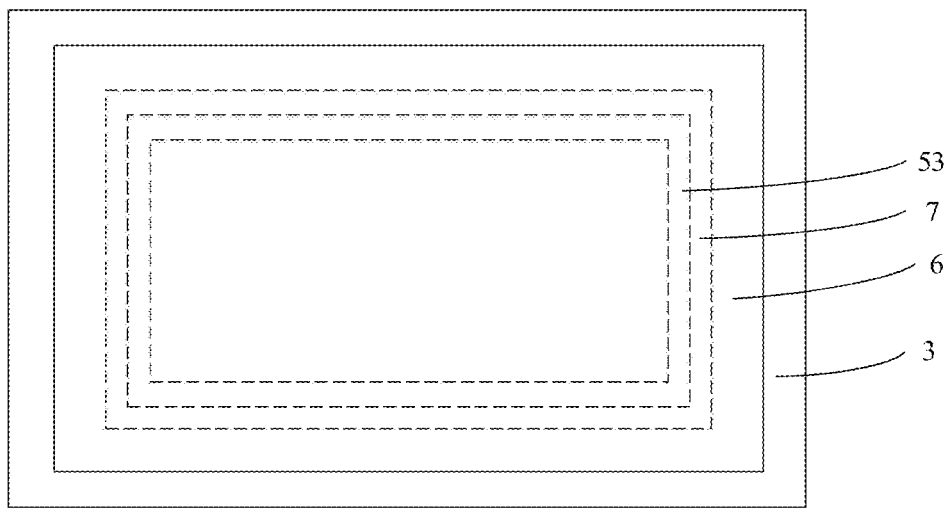
FIG. 7 is a schematic top view of a display panel according to an embodiment of the present disclosure.

FIG. 7 is a schematic top view of a display panel according to an embodiment of the present disclosure. In some embodiments of the present disclosure, an encapsulation layer (such as a TFE encapsulation, or an inorganic encapsulation layer, and the material of the inorganic encapsulation layer includes, but is not limited to, one or more of SiOx, SiNx, and SiON) may wrap layers under it (for example, the second electrode 53 and the pixel definition layer 7 shown by the dashed box in FIG. 7), so as to improve the encapsulating effect of the display panel and improve the yield and life of the display panel.

In some embodiments, the orthographic projection of the encapsulation layer 6 on the first substrate 1 completely covers the orthographic projection of the second electrode 53 on the first substrate 1.

In some embodiments, the orthographic projection of the encapsulation layer 6 on the first substrate 1 is a ring structure, and its orthographic projection on the first substrate 1 partially overlaps with the orthographic projection of the second electrode 53 on the first substrate 1. For example, the orthographic projection of the encapsulation layer 6 on the first substrate 1 may be around the edge of the area where the second electrode 53 is located. The display panel may further include a driving circuit layer 8 provided between the first substrate 1 and the first protrusion 41 to drive the light emitting device 5.

According to some embodiments of the disclosure, the light emitting device 5 includes a first electrode 51, a light-emitting layer 52, and a second electrode 53 sequentially disposed in a direction away from the first substrate. The pixel definition layer 7 has a first portion 71 located between the driving circuit layer 8 and the light emitting layer 52 and a second portion 72 located between the first electrode 51 and the light emitting layer 52, with a third portion 73 in a gap between the driving circuit layer 8 and the first electrode 51, the third portion 73 contacting the first substrate. The first portion 71 extends beyond the second electrode 53 in a direction toward the bonding portion 3. Such an arrangement can improve production yield. For example, when an open mask is used to form the second electrode 53, the first portion 71 can prevent the mask from damaging (e.g., scratching) the layer below the first portion 71, thereby avoiding short circuit of the driving circuit layer 8 and the second electrode 53.

The display panel of the embodiments of the present disclosure can realize a narrow frame structure, reduce the overlapping area of the second electrode 53 and the driving circuit layer 8, and reduce the parasitic capacitance of the panel.

The first electrode may be an anode. The second electrode may be a cathode. The first electrode and the second electrode may include at least one of a metal material and a transparent conductive oxide material. For example, the metal material may include any of Ag, Cu, Al, Mo, and alloys thereof. The transparent conductive oxide material may include any of ITO, AZO. The first electrode and the second electrode may have a single-layer structure or a stacked structure. The stacked structure may be Mo/AlNd/ITO or ITO/Ag/ITO.

Other traces of the present disclosure may include at least one of a metal material and a transparent conductive oxide material. For example, the metal material may include any of Ag, Cu, Al, Mo, and alloys thereof. The transparent conductive oxide material may include any of ITO, AZO. The first electrode and the second electrode may have a single-layer structure or a stacked structure. The stacked structure may be Mo/AlNd/ITO or ITO/Ag/ITO.

The display panel of the embodiments of the present disclosure may further include a filler 9 disposed between the encapsulation layer 6 and the second substrate 2. The filler can relieve the stress between the first substrate 1 and the second substrate 2.

Figure 4:
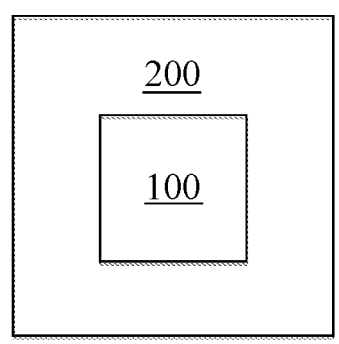
FIG. 4 is a schematic view of a display device according to an embodiment of the present disclosure.

FIG. 4 is a schematic view of a display device according to an embodiment of the present disclosure. As shown in FIG. 4, a display device 200 according to an embodiment of the present disclosure includes a panel 100. The display panel 100 may include a display panel as described above. For example, the display panel 100 may be a display panel shown in any one of FIGS. 1-3.

The display device in the embodiments of the present disclosure may be any product or component having a display function, such as a mobile phone, a tablet computer, a television, a notebook computer, a digital photo frame, and a navigator.

Embodiments of the present disclosure also provide a method of manufacturing a display panel.

Figure 5:
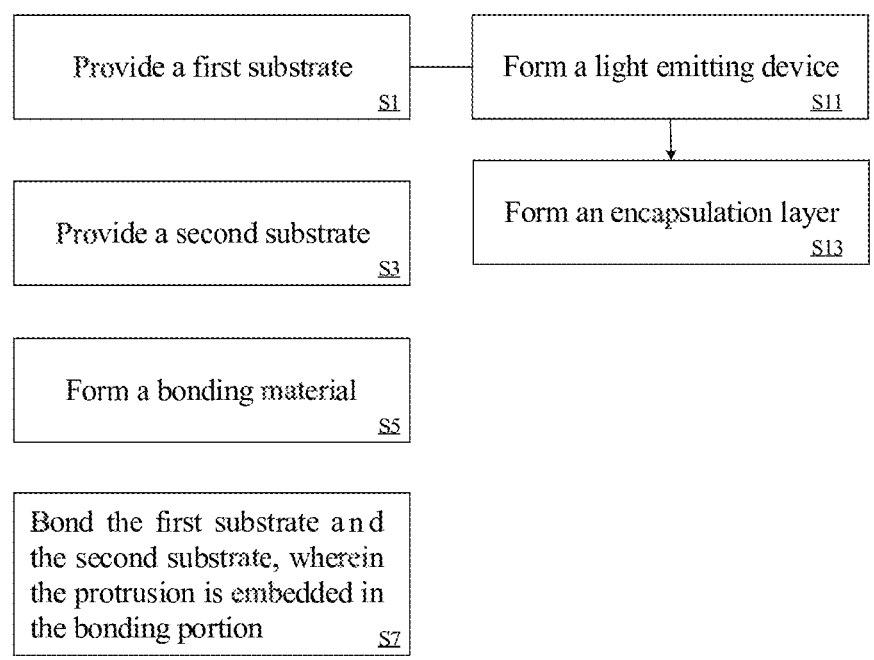
FIG. 5 is a flowchart of a method of manufacturing a display panel according to an embodiment of the present disclosure.
Figure 6A:
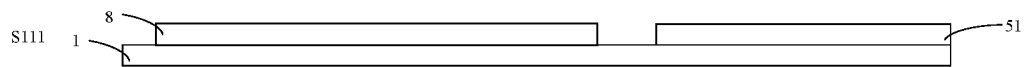
FIGS. 6A-6E are schematic views of a method for forming a light emitting device in a method of manufacturing a display panel according to an embodiment of the present disclosure.
Figure 6B:
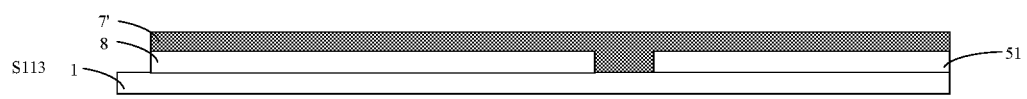
Figure 6C:
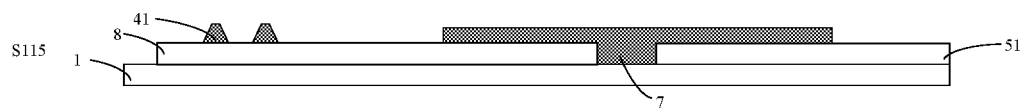
Figure 6D:
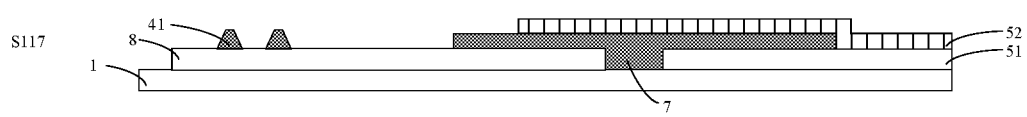
Figure 6E:
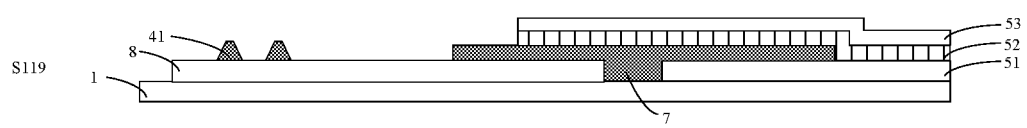

FIG. 5 is a flowchart of a method of manufacturing a display panel according to an embodiment of the present disclosure. As shown in FIG. 5, a method for manufacturing a display panel according to an embodiment of the present disclosure includes:

S1. providing a first substrate;

S3. providing a second substrate, wherein a protrusion is disposed on at least one of the first peripheral region of the first substrate and the second peripheral region of the second substrate;

S5. forming a bonding material on at least one of the first peripheral region of the first substrate and the second peripheral region of the second substrate;

S7. bonding the first substrate and the second substrate so that the bonding material forms a bonding portion bonding the first peripheral region and the second peripheral region, wherein the protrusion is embedded in the bonding portion.

Further, providing the first substrate may include:

S11. forming a light emitting device on the first substrate;

S13. forming (for example, plasma enhanced chemical vapor deposition, PECVD) an encapsulation layer covering the light emitting device on the light emitting device, wherein a projection of the bonding portion on the first substrate at least partially overlaps with a projection of the encapsulation layer on the first substrate.

FIGS. 6A-6E are schematic views of a method for forming a light emitting device in a method of manufacturing a display panel according to an embodiment of the present disclosure. As shown in FIGS. 6A-6E, a method for forming a light emitting device according to an embodiment of the present disclosure includes:

S111. Forming a first electrode 51 and a driving circuit layer 8 on the first substrate 1.

S113. Disposing (for example, coating) a pixel definition material layer 7' on the first electrode 51 and the driving circuit layer 8.

S115. Patterning the pixel definition material layer 7' to form a pixel defining layer 7 and a first protrusion 41, wherein the pixel defining layer 7 covers a surface of the first substrate 1 between the first electrode 41 and the driving circuit layer 8, a part of an upper surface of the first electrode 41 and a part of an upper surface of the driving circuit layer 8.

S117. Forming (e.g., vapor-depositing) a light emitting layer 52 on the first electrode 41 and a part of the pixel defining layer 7; and S119. forming (e.g., sputtering) a second electrode 53 on the light emitting layer 52.

The embodiments of the present disclosure can be applied to manufacturing processes of AM-OLED display panels using thin-film transistors (TFT) with different structures as switch control units. For example, it can be used in device structures such as top gate, back channel etch (BCE) structure, and etch stop layer (ESL). The embodiments of the present disclosure can also be applied to TFTs using various oxides, silicon materials, and organic materials as active layers. For example, the material of the active layer may include at least one of the following: a-IGZO, ZnON, IZTO, a-Si, p-Si, hexathiophene, and polythiophene. In other words, the embodiments of the present disclosure are also applicable to an active matrix of an OLED display backplane manufactured based on oxide technology, silicon technology, and organic technology.

In the embodiments of the present disclosure, the buffer layer, the gate insulating layer, the interlayer dielectric layer, and the passivation layer of the TFT of the display panel may include at least one of the following materials: an inorganic dielectric material, an organic dielectric material, and a high-K dielectric material. Inorganic dielectric materials include, but are not limited to, SiOx, SiNx, and SiON. High-K materials include, but are not limited to, AlOx, HfOx, and TaOx.

The specific embodiments have been described, and are not intended to limit the scope of the disclosure. In fact, the novel embodiments described herein can be implemented in a variety of other forms. In addition, various omissions, substitutions, and changes in the form of the embodiments described herein may be made without departing from the spirit of the disclosure. The following claims and their equivalents are intended to cover such forms or modifications that fall within the scope and spirit of the disclosure.

What is claimed is:

1. A display panel comprising:
   a first substrate and a second substrate opposite to each other;
   a bonding portion bonding a first peripheral region of the first substrate and a second peripheral region of the second substrate;
   a first protrusion disposed on the first peripheral region of the first substrate, wherein the first protrusion is embedded in the bonding portion;
   a driving circuit layer disposed between the first substrate and the first protrusion;
   a light emitting device disposed on a side of the first substrate facing the second substrate, the light emitting device comprising a first electrode, a light-emitting layer, and a second electrode sequentially disposed in a direction away from the first substrate, wherein a gap is located between the first electrode and the driving circuit layer and exposes the first substrate; and
   a pixel definition layer on the side of the first substrate facing the second substrate and located between the first substrate and the light emitting device, wherein the pixel definition layer has a first portion located between the driving circuit layer and the light-emitting layer, a second portion located between the first electrode and the light-emitting layer, and a third portion located between the first portion and the second portion and filling the gap and contacting the first substrate, and wherein the first portion extends beyond the second electrode in a direction toward the bonding portion.

2. The display panel according to claim 1, further comprising:
   an encapsulation layer covering the light emitting device, wherein a projection of the bonding portion on the first substrate at least partially overlaps a projection of the encapsulation layer on the first substrate.

3. The display panel according to claim 2, wherein a material of a portion, in contact with the bonding portion, of the encapsulation layer and a material of the bonding portion are either organic materials or inorganic materials.

4. The display panel according to claim 3, wherein a projection of the second electrode on the first substrate overlaps a projection of the encapsulation layer on the first substrate.

5. The display panel according to claim 2, further comprising a second protrusion provided in the second peripheral region of the second substrate, wherein the second protrusion is embedded in the bonding portion, and wherein a projection of the first protrusion on the first substrate does not overlap a projection of the second protrusion on the first substrate.

6. The display panel according to claim 1, further comprising a second protrusion provided in the second peripheral region of the second substrate, wherein the second protrusion is embedded in the bonding portion, and wherein a projection of the first protrusion on the first substrate does not overlap a projection of the second protrusion on the first substrate.

7. The display panel according to claim 6, wherein the first protrusion is arranged in a same layer as the pixel definition layer.

8. A display device comprising the display panel according to claim 1.

9. A display device comprising the display panel according to claim 2.

10. A display device comprising the display panel according to claim 3.

11. A display device comprising the display panel according to claim 4.

12. A display device comprising the display panel according to claim 6.

13. A display device comprising the display panel according to claim 7.

14. A method for manufacturing a display panel, the method comprising:
    providing a first substrate, wherein a first protrusion is disposed on a first peripheral region of the first substrate;
    forming a driving circuit layer and a first electrode on the first substrate, wherein a gap is provided between the first electrode and the driving circuit layer and exposes the first substrate;
    forming a pixel definition layer on the driving circuit layer, the first substrate, and first electrode;
    forming a light-emitting layer on the first electrode and a part of the pixel definition layer;
    forming a second electrode on the light-emitting layer, wherein the pixel definition layer has a first portion located between the driving circuit layer and the light-emitting layer, a second portion located between the first electrode and the light-emitting layer, and a third portion located between the first portion and the second portion and filling the gap and contacting the first substrate, and wherein the first portion extends beyond the second wherein the first electrode, the light-emitting layer, and the second electrode form a light emitting device; electrode in a direction toward the bonding portion;
    providing a second substrate;
    forming a bonding material on at least one of the first peripheral region of the first substrate and a second peripheral region of the second substrate; and
    bonding the first substrate and the second substrate so that the bonding material forms a bonding portion bonding the first peripheral region and the second peripheral region, wherein the first protrusion is embedded in the bonding portion.

15. The method of claim 9, wherein providing the first substrate comprises:
    forming an encapsulation layer covering a the light emitting device, wherein a projection of the bonding portion on the first substrate at least partially overlaps a projection of the encapsulation layer on the first substrate.

16. The method according to claim 15, wherein forming the pixel definition layer comprises:

forming a first electrode and a driving circuit layer on the first substrate;

disposing a pixel definition material layer on the first electrode, the first substrate, and the driving circuit layer; and patterning the pixel definition material layer to form the pixel definition layer and the first protrusion, wherein the pixel definition layer covers a surface of the first substrate between the first electrode and the driving circuit layer, a part of an upper surface of the first electrode, and a part of an upper surface of the driving circuit layer.

* * * * *

UNITED STATES PATENT AND TRADEMARK OFFICE
CERTIFICATE OF CORRECTION

PATENT NO. : 11,296,299 B2  
APPLICATION NO. : 16/757081  
DATED : April 5, 2022  
INVENTOR(S) : Guoying Wang et al.

Page 1 of 1

It is certified that error appears in the above-identified patent and that said Letters Patent is hereby corrected as shown below:

In the Claims

In Claim 14, Column 8, Lines 50-54, "beyond the second wherein the first electrode, the light-emitting layer, and the second electrode form a light emitting device; electrode in a direction toward the bonding portion;"
should read -- beyond the second electrode in a direction toward the bonding portion;
   wherein the first electrode, the light-emitting layer, and the second electrode form a light emitting device; --.

In Claim 15, Column 8, Line 64, "method of claim 9" should read -- method of claim 14 --.

In Claim 15, Column 8, Line 66, "covering a the light" should read -- covering the light --.

In Claim 16, Column 9, Lines 4-7, "comprises:
forming a first electrode and a driving circuit layer on the first substrate;
disposing a pixel definition material layer on the first"
should read -- comprises:
disposing a pixel definition material layer on the first --.

Signed and Sealed this  
Twenty-eighth Day of June, 2022

Katherine Kelly Vidal  
*Director of the United States Patent and Trademark Office*